(12) United States Patent
Koizumi

(10) Patent No.: US 7,046,707 B2
(45) Date of Patent: May 16, 2006

(54) SEMICONDUCTOR LASER DEVICE AND FABRICATING METHOD THEREFOR

(75) Inventor: Hideshi Koizumi, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 362 days.

(21) Appl. No.: 10/205,618

(22) Filed: Jul. 26, 2002

(65) Prior Publication Data

US 2003/0235223 A1  Dec. 25, 2003

(30) Foreign Application Priority Data

Jul. 26, 2001 (JP) ............................. 2001-226280
Jun. 25, 2002 (JP) ............................. 2002-184882

(51) Int. Cl.
    *H01S 5/00* (2006.01)
(52) U.S. Cl. .......................................... 372/43; 372/36
(58) Field of Classification Search ................ 372/36, 372/109, 43; 257/99, 100, 690, 698, 701–703, 257/774
    See application file for complete search history.

(56) References Cited

U.S. PATENT DOCUMENTS

| 5,052,009 | A | * | 9/1991 | Tsuboi et al. ................. 372/36 |
| 5,140,384 | A | * | 8/1992 | Tanaka ......................... 357/17 |
| 5,485,479 | A | * | 1/1996 | Kitamura et al. .............. 372/43 |
| 5,500,768 | A | * | 3/1996 | Doggett et al. ............. 359/652 |
| 5,519,720 | A | * | 5/1996 | Hirano et al. ................. 372/36 |
| 5,557,116 | A |   | 9/1996 | Masui et al. |
| 5,614,735 | A | * | 3/1997 | Kitamura et al. ............. 257/99 |
| 5,677,570 | A | * | 10/1997 | Kondoh et al. ............. 257/690 |
| 5,891,758 | A | * | 4/1999 | Honda et al. ............... 438/118 |
| 6,577,656 | B1 | * | 6/2003 | Chen et al. ................... 372/36 |

FOREIGN PATENT DOCUMENTS

| JP | U523563 | 3/1993 |
| JP | A6350131 | 12/1994 |
| JP | A200012972 | 1/2000 |

* cited by examiner

*Primary Examiner*—David Porta
*Assistant Examiner*—Davienne Monbleau
(74) *Attorney, Agent, or Firm*—Morrison & Foerster LLP

(57) ABSTRACT

A semiconductor laser device has a support body constructed of a disk-shaped section and a columnar body formed in a central portion of this disk-shaped section, one set of leads fit to this support body in an integrated manner, a semiconductor laser element mounted on a reference surface of the columnar body, and a wire for electrically connecting this semiconductor laser element with one of the leads. The disk-shaped section of the support body has an opening therethrough. The one set of leads are inserted through the opening, placed in position, and integrated with the support body via a resin block filling the opening.

16 Claims, 8 Drawing Sheets

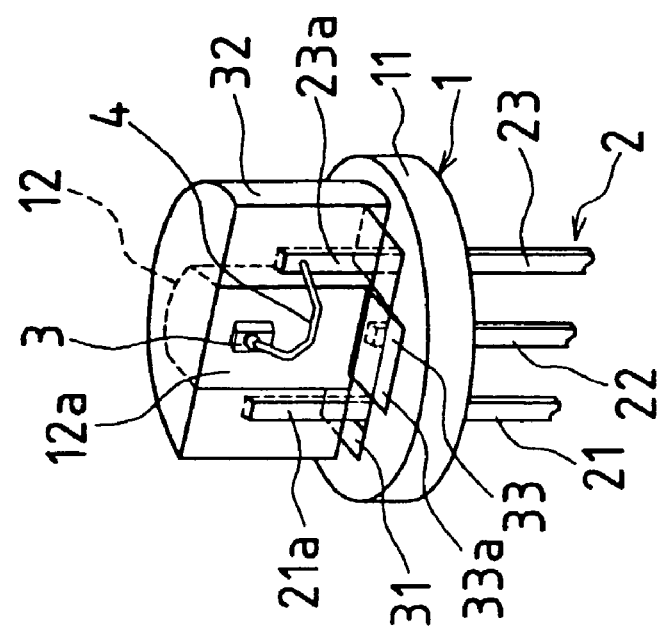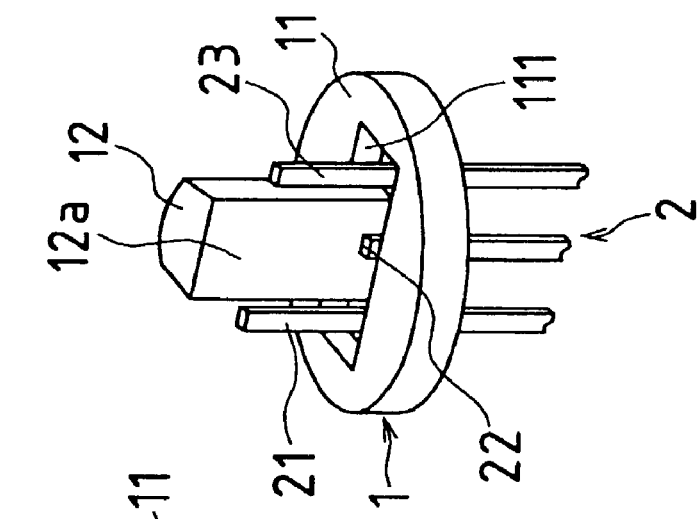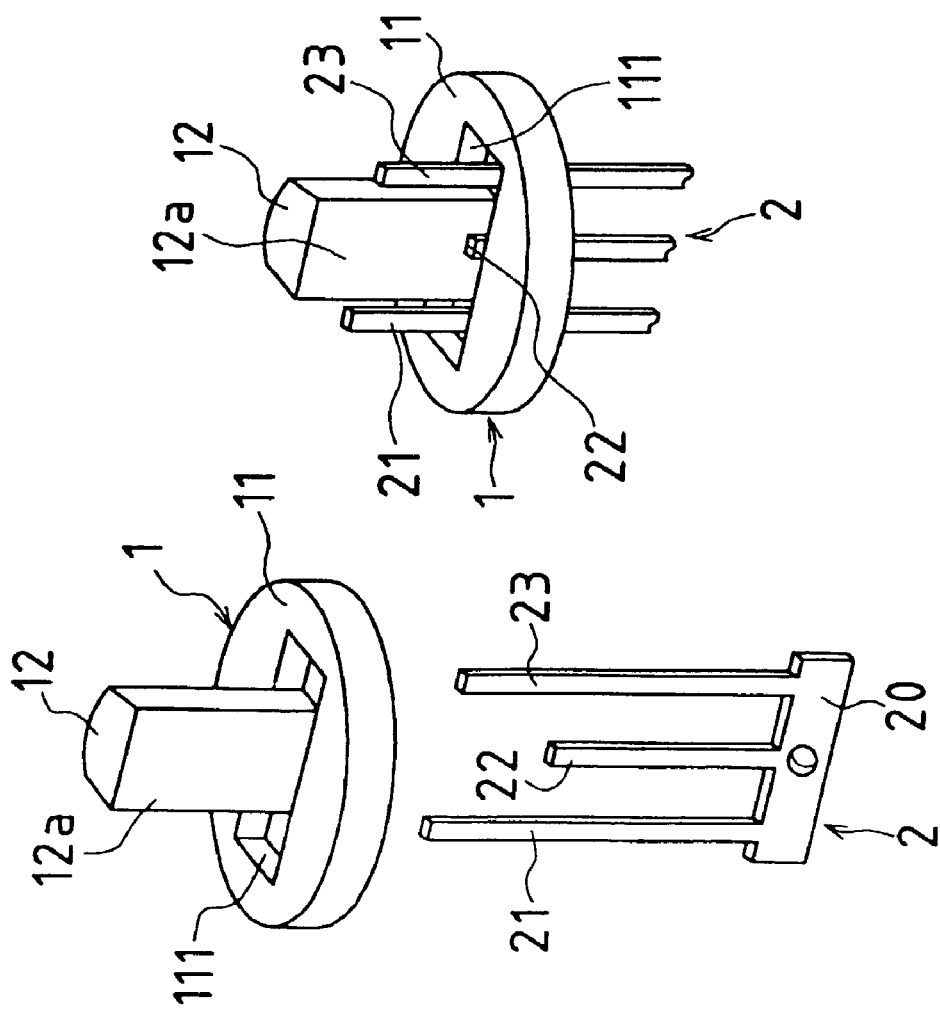

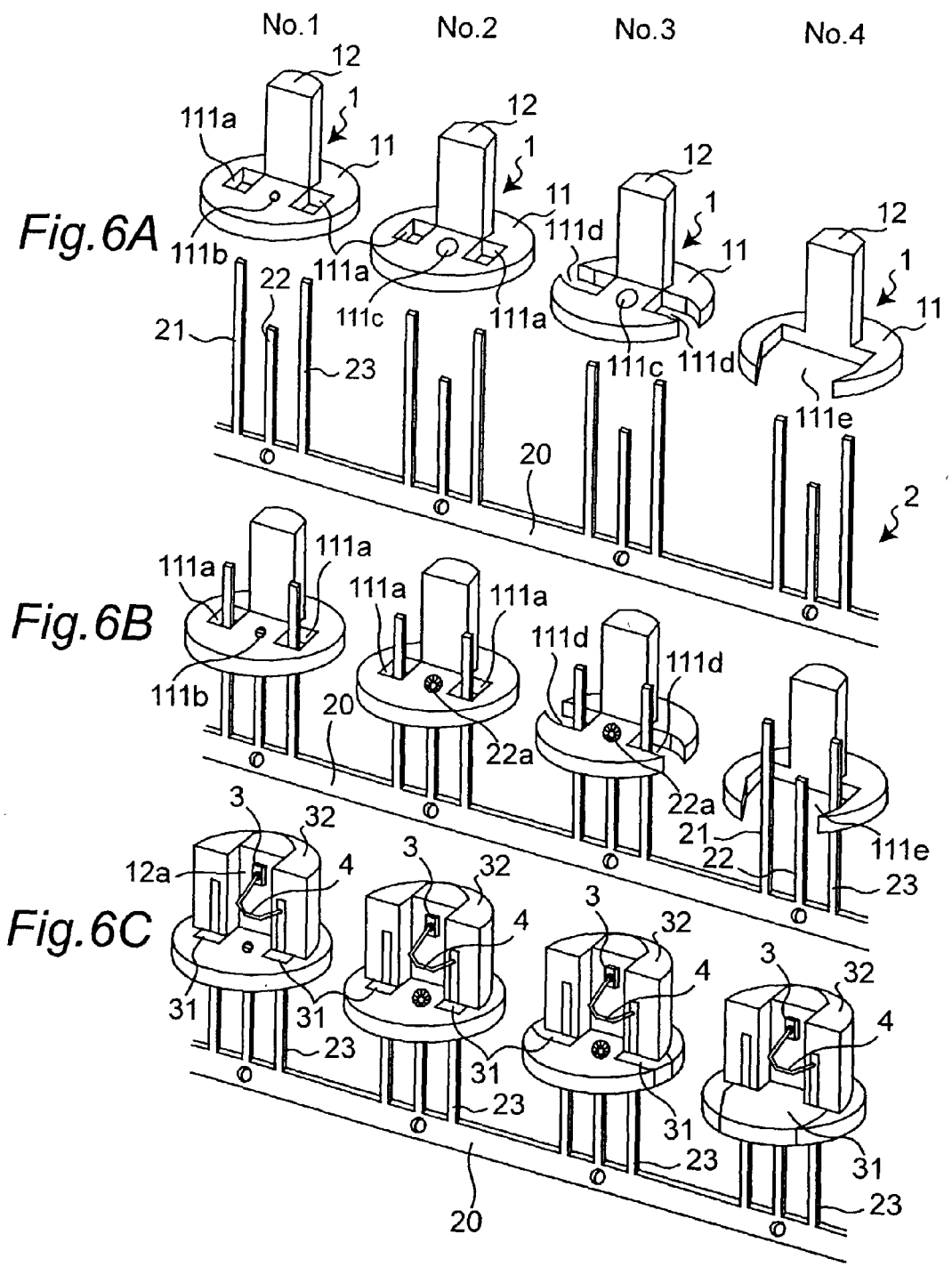

US 7,046,707 B2

SEMICONDUCTOR LASER DEVICE AND FABRICATING METHOD THEREFOR

BACKGROUND OF THE INVENTION

The present invention relates to an electronic component package structure that employs a semiconductor laser (LD) and a fabricating method therefor, and in particular, to a semiconductor laser device to be built in an optical pickup for use in an optical disc system of, for example, compact disc or digital video disc and a fabricating method therefor.

Conventionally, with regard to the semiconductor laser device, an hermetically sealed airtight type device, which employs a CAN type metallic stem, is going mainstream. Moreover, with regard to the semiconductor laser device, CAN type stems of the standard configurations of diameters of 5.6 mm and 9 mm are normally used for optical pickups intended for, for example, compact discs and digital video discs. FIGS. 4A and 4B show the basic structures of these stems.

A semicircular columnar chip mounting section 52 is formed on a disc-shaped stem 51 in a central position thereof, and openings 53 and 53 for receiving leads 55 and 56 therethrough are formed through the stem 51 in the vicinity of this chip mounting section 52. Then, the leads 55 and 56 are inserted through the respective openings 53 and 53, and the openings are peripherally filled with a low melting point glass 54 in order to secure insulation of the leads 55 and 56 from the stem 51, thereby fixing the leads 55 and 56 to the stem 51.

On the other hand, a semiconductor laser element 57 is mounted on a reference surface (mounting surface) 52a of the chip mounting section 52, and connected to one lead 56 via a wire 58.

Then, by mounting and fixing a cylindrical cap section 59 onto the stem 51 in this state, a semiconductor laser device of the CAN stem type shown in FIG. 4B is completed.

In order to improve the hermetic characteristic and transmittance at a specified wavelength, an AR-coated glass member 591 is stuck to a laser light-emitting window 59a of the cap section 59 with a low melting point glass or the like.

As a device that belongs to the CAN stem type semiconductor laser device, a semiconductor laser unit described in Japanese Patent Laid-Open Publication No. 2000-77792 can be enumerated.

Moreover, a semiconductor laser device of an inexpensive open package structure called the "frame laser" in which a lead frame and resin are molded in an integrated body has recently appeared mainly for the compact disc playback use. FIG. 5 shows the basic structure of the semiconductor laser device of this open package structure.

A plurality of sets of three leads 61, 62 and 63 are joined to one another via a tie bar 60 to form a lead frame, and each of the sets of leads 61 through 63, thus joined to one another, is integrally molded with a resin material 64 that becomes a housing. Subsequently, a semiconductor laser element 65 is mounted on a chip mounting surface 62a formed at the tip of the lead 62 positioned at the center. By electrically connecting this semiconductor laser element 65 with one side lead 63 via a wire 66 and finally severing the tie bar 60, a semiconductor laser device of the open package structure is completed.

In the package of the hermetic structure of the CAN type that employs the conventional metallic stem, the metallic stem 51 and the metallic cover (cap section 59) called a cap are employed, which results in an increased number of components. Moreover, it is a general way to stick the AR-coated glass member 591 to the laser light-emitting window 59a of the cap section 59 with a low melting point glass or the like in order to increase the hermetic characteristic and transmittance at the specified wavelength, and this has disadvantageously been a bottleneck in reducing the cost of the components.

Moreover, it is required to secure the insulation of the leads 55 and 56 against the stem 51, and therefore, in implanting the leads 55 and 56 in the stem 51, the leads 55 and 56 are retained with interposition of the low melting point glass while maintaining the hermetic characteristic. This has led to the problem that the stems 51 have been obliged to be supplied separately, so that it is impossible to realize an efficient process of assembling the devices in a joined state.

On the other hand, in order to solve the aforementioned problems of the CAN type laser package, the laser package of the structure called the "frame package", in which the lead frame and the resin housing are molded in an integrated body, as described above, has been developed.

However, there has been an immanent problem that a heat dissipation characteristic, which has not become a serious problem since the semiconductor laser element is mounted on the metallic stem portion in the CAN type package, is deteriorated in the "frame laser", and this has led to the problem that a laser chip (semiconductor laser element) of a bad thermal characteristic and a high-output laser chip with large heat generation cannot be mounted. Moreover, on the background that the "frame laser" has been developed giving priority to its productivity and price, no industry-standard configuration has been determined, and this has led to the problem that the configuration of the pickup housing is obliged to be altered in order to make full use of the device on the user side.

SUMMARY OF THE INVENTION

With a view to solving the aforementioned problems, the present invention has an object of providing a semiconductor laser device capable of maintaining or improving the heat dissipation characteristic while keeping compatibility with the semiconductor laser device of the CAN type, and a fabricating method therefor. Another object is to provide a semiconductor laser device and a fabricating method therefor allowing use of a string of joined leads to thereby reduce the costs of components, reduce the number of assembly process steps, and consequently reduce the assembly cost.

The present invention provides a semiconductor laser device comprising:

a conductive support body constructed of a base section and a mounting section provided on the base section;

a semiconductor laser element mounted on the mounting section; and one set of leads integrally fit to the support body, wherein:

the base section has at least one penetrating opening;

the one set of leads includes at least one first lead which is electrically and mechanically connected to the support body, and at least one second lead which is not electrically connected to the support body; and said at least one penetrating opening receives at least the second lead inserted and is filled with a resin block which integrally fixes the lead inserted in the opening to the support body.

As a material for the resin block, a resin for general electronic components, such as liquid crystal polymer resin and PPS, can be employed.

The support body may desirably be formed of a material which has satisfactory insulating properties and heat dissipation properties, and, for example, Kovar™, inexpensive iron-based metal, aluminum and brass can be employed.

Moreover, the one set of leads can be provided by a lead frame.

According to the present invention having the aforementioned features, because the semiconductor laser element is mounted on the mounting section of the support body, a heat dissipation characteristic similar to that of the conventional CAN type package can be maintained, and a high-output laser chip can be mounted. Moreover, the base section can be formed into a disk-like shape, and the mounting section can be formed into a columnar shape. That is, according to the present invention, the support body is able to have a shape compatible with that of the CAN package stem. Therefore, in adopting the package of the semiconductor laser device of the present invention, the user can minimize the design change about the pickup housing.

Furthermore, the structure in which at least the second lead is integrally fixed to the support body by the resin block enables the use of a lead frame as the leads. Therefore, the device can efficiently be assembled and thus fabricated at low costs.

In one embodiment, the mounting section and a portion of the second lead that extends along the mounting section are entirely covered with an insulator except for a reference surface of the mounting section and a surface of the second lead that is located on the same side as the reference surface. This insulator may be formed of the same resin material as the material of the resin block.

With regard to the shape of the support body, the conventional CAN type has been required to be covered with a cap, and accordingly, there have been restrictions in the structure and size of the upright block of the laser chip (semiconductor laser element) mounting section. However, this embodiment of the present invention, which needs no cap, enables the size of the mounting section of the support body to be increased to the verge of the base section depending on the mold structure of the resin member and consequently enables the heat dissipation characteristic to be improved further than that of the CAN type semiconductor laser device. Furthermore, the needlessness of a cap enables the cost reduction.

In one embodiment, the base section has only one penetrating opening, the one set of leads is inserted in this one opening, and this one set of leads is integrally fixed to the support body by the resin block. In this case, the first lead can be mechanically and electrically connected to the support body by welding or the like. Moreover, the opening can be enlarged well enough in comparison with that of the conventional CAN stem type semiconductor laser device, and therefore, this opening can easily be formed by press working. Furthermore, one set of leads is collectively fixed to the support body in a lump by the resin block, and therefore, the assembling time can be shortened.

It is preferable that a tip of the first lead is completely buried in the resin block.

There is no problem in the case of the support body in which the base section has a comparatively large dimension of about 5.6 mm in diameter. However, if the size of the support body is reduced to, for example, about 3.0 mm or less in diameter of the base section, then it becomes difficult to open a through hole for the insertion of a lead therethrough by press working when the base section has a thickness of about 1 mm for the sake of securing the normal heat radiation and reference surface accuracy.

With regard to the joining of the lead to the support body, the joining is to be performed at a small opening, leading to difficulties in performing the joining even with a technique capable of performing joining in a narrow region, such as a welding technique by means of laser, for the irradiation angle becomes shallow.

Furthermore, when the support body and the lead are joined to each other by welding, the fabricating apparatus for the semiconductor laser device has a large scale and control of the size of a portion to be fused of the lead and the support body is difficult. Therefore, when, in particular, the device size is reduced, it becomes difficult to secure the shape/dimension accuracy in the vicinity of the portion to be welded. Moreover, carbon contained in the metal is burned by heat during welding and becomes soot, which possibly becomes a factor to impair the aesthetical performance and wire bonding performance.

In order to solve the aforementioned problems, in one embodiment, the one set of leads and the support body are formed of materials of which linear expansion coefficients are approximately same. With this arrangement, to join a lead to the support body, it is possible to adopt the methods of press-fitting and caulking, besides the welding method.

For example, the base section may further be provided with a hole in which the first lead is press-fit. By press-fitting the first lead in this hole, the first lead is electrically and mechanically connected to the support body. Alternatively, the base section may further be provided with a hole through which the first lead is inserted, with an end of the first lead, located on the semiconductor laser element side, collapsed or crushed for caulking whereby the first lead is electrically and mechanically connected to the support body.

Adopting the methods of press-fitting and caulking as a method for joining the lead to the support body allows the lead to be joined to the support body without subjecting them to a thermal process. This enables the prevention of deformation of the components and soot contamination which will take place when welding is adopted.

When the methods of press-fitting and caulking are adopted, it is possible to maintain the strength of the joined portion regardless of a temperature change by adopting materials of approximately same linear expansion coefficients for the lead and the support body. Moreover, in the case of collapsing the head portion of the inserted lead for connection to the support body, stronger connection than in the case of press-fitting can be achieved with regard to the lead pull-out strength, and the through hole diameter can be made slightly larger.

In one embodiment, the opening filled with the resin block is open in a direction approximately perpendicular to a direction in which this opening penetrates the base section. By thus making the opening open in that direction, the press working process of the support body can be made simple, and the degree of freedom in selecting a method of joining the lead to the support body can be exalted. As a result, the miniaturization of the device can be promoted.

Preferably, the opening may have a width that is narrower in a peripheral open portion than in a central portion. This arrangement can avoid a risk that the leads and the resin block that supports the leads separate from and fall off the support body.

In one embodiment, the semiconductor laser device has means for preventing light emitted from the semiconductor laser element from returning to the semiconductor laser element.

In one example, the means for preventing the emitted light from returning to the semiconductor laser element comprises an inclined surface provided on a portion of the resin block or the insulator on which the emitted light from the semiconductor laser element directly strikes.

Moreover, in one embodiment, in order to prevent the eclipsing or blocking of the emitted light from the semiconductor laser element, at least part of an end portion of the laser element mounting surface of the mounting section, which end portion is located on the side from which light from the laser element is emitted to the outside, is cut away so as to form, for example, an inclined surface or a stepped surface. That is, in this embodiment, a part (located on the side from which the laser beam is emitted to the outside) of the laser element mounting surface is removed in conformity to the shape of radiation of the beam. Practically, if the laser element mounting surface does not have the above-mentioned shape, then the emitted beam may be partially eclipsed or blocked by the edge of the mounting surface depending upon the laser element mounting position and the shape of the mounting surface, impairing the symmetry of the beam shape. However, in the case of this example, by removing the portion of the element mounting surface on the side on which the laser beam is emitted to the outside, the problem of the impairment of the beam radiation shape can be avoided.

The present invention provides a method of fabricating a semiconductor laser device which includes a conductive support body having a base section and a mounting section provided on the base section, a semiconductor laser element mounted on the mounting section, and one set of leads integrally fit to the support body, comprising the steps of:

inserting the one set of leads joined by a tie bar through an opening formed at the base section of the support body;

welding at least one of the one set of leads to the support body to thereby fix the one set of leads to the support body; and molding an insulating material so as to integrate the one set of leads with the support body by the insulating material in such a manner that the mounting section and portions of the one set of leads extending along the mounting section, inclusive of the opening, are entirely covered with the insulating material except for a reference surface of the mounting section and at least those surfaces of the one set of the leads that are located on the same side as the reference surface.

In this case, the step of molding an insulating material so as to integrate the one set of leads with the support body by the insulating material may comprise a step of integrating the one set of leads and the support body with resin by an insert molding method. Moreover, the step of welding at least one of the leads in the one set to the support body can adopt laser welding, electric welding or ultrasonic welding.

The present invention provides another method of fabricating a semiconductor laser device which includes a conductive support body having a base section and a mounting section provided on the base section, a semiconductor laser element mounted on the mounting section, and one set of leads integrally fit to the support body, comprising the steps of:

joining at least one of the leads joined via a tie bar to the support body by either press-fitting said at least one lead into a corresponding hole formed in the base section of the support body or inserting said at least one lead through a corresponding through hole formed in the base section of the support body and collapsing a tip of the lead for caulking;

inserting the remaining ones of the leads through at least one opening formed through the base section of the support body; and molding an insulating material so as to integrate the leads inserted through the opening with the support body by the insulating material in such a manner that the mounting section and portions of the leads extending along the mounting section, inclusive of the opening, are entirely covered with the insulating material, except for a reference surface of the mounting section and at least those surfaces of the leads inserted through the opening that are located at least on the same side as the reference surface.

By either method, the leads can be put into the process in the form of a frame of joined leads. Therefore, the processing time of the assembly steps such as laser chip mounting and wiring can be shortened and the assembly efficiency is increased.

Moreover, by the latter method, the lead is joined to the support body by press-fitting or caulking. Therefore, the problems of component deformation and contamination due to soot, which may be caused in the case of welding, do not occur.

In one embodiment, a plurality of sets of leads are joined to one another via the tie bar, and a plurality of semiconductor laser devices are concurrently fabricated using the plurality sets of leads and a plurality of support bodies.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A, 1B and 1C are perspective views of a semiconductor laser device according to a first embodiment of the present invention in different states, where FIG. 1A shows a state in which a support body and one set of leads are separated apart, FIG. 1B shows a state in which the one set of leads is inserted in an opening of the support body and FIG. 1C shows a completed semiconductor laser device.

FIGS. 6A, 6B and 6C are explanatory views showing the processes for fabricating a semiconductor laser device according to a second embodiment, which employs four different kinds of support bodies;

FIG. 7A shows a state in which a lead frame is joined to the support bodies and FIG. 7B shows a state in which a laser chip is mounted on the mounting surface and wire bonded.

DETAILED DESCRIPTION OF THE PREFERRED EMBODIMENTS

Embodiments of the present invention will be described below with reference to the drawings.

First Embodiment

Figure 2:
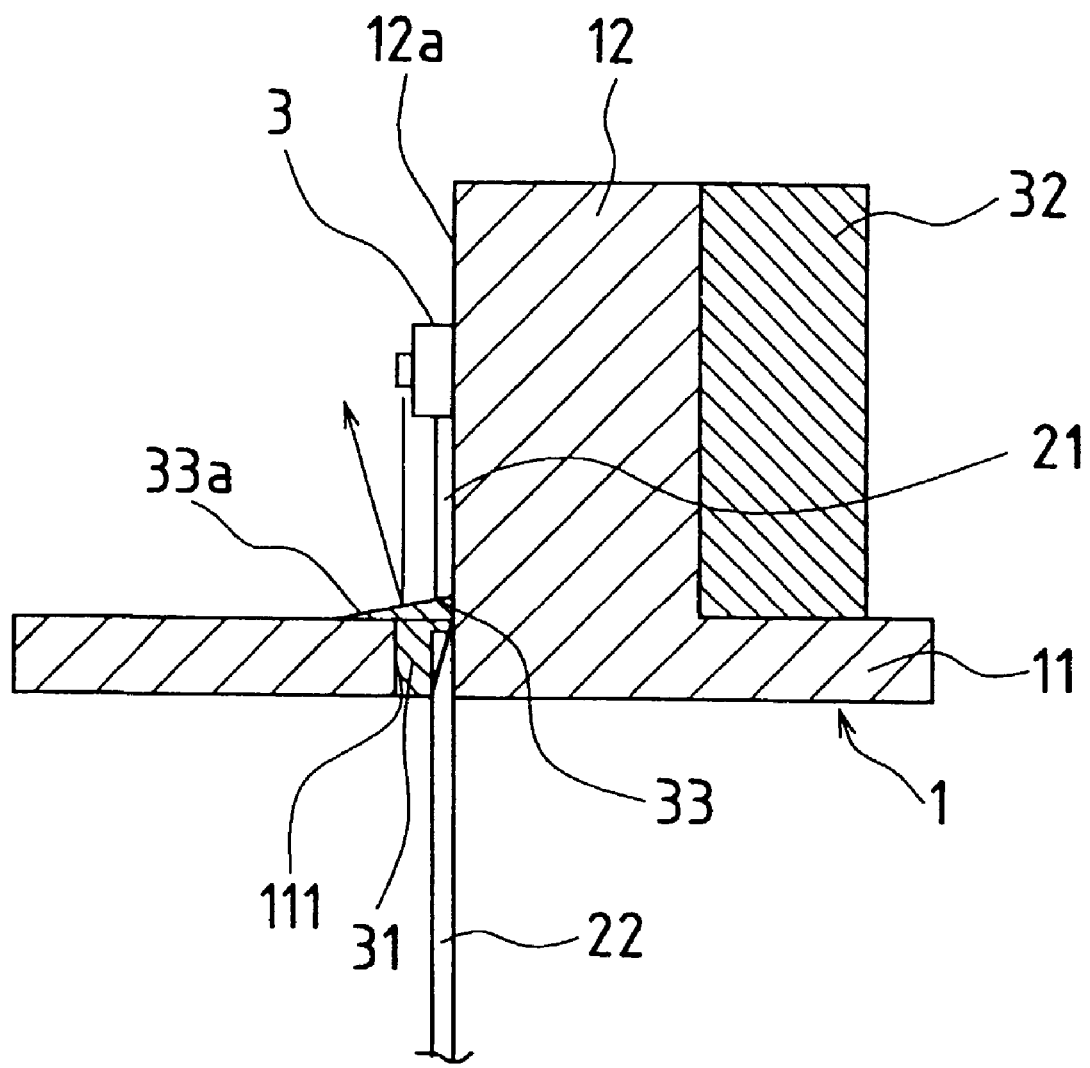
FIG. 2 is a vertically sectional view of the semiconductor laser device shown in FIG. 1C.

FIGS. 1A, 1B and 1C show the external appearance of a semiconductor laser device according to the first embodiment of the present invention in different states, and FIG. 2 shows a vertical longitudinal sectional view of the device.

This semiconductor laser device has a support body 1 constructed of a disk-shaped base section (hereinafter referred to as a disk-shaped section) 11 and a columnar mounting section (hereinafter referred to as a columnar body) 12 formed in a center position of this disk-shaped section 11, one set of a plurality of (three in the present embodiment) leads 21, 22 and 23 (shown in the form of a lead frame 2 in which these leads are joined to one another via a tie bar 20 in the figures) to be mounted on this support body 1 in an integrated body, a semiconductor laser element 3 mounted on a reference surface 12a of the columnar body 12 and a wire 4 for electrically connecting this semiconductor laser element 3 to the lead 23. The support body 1 is formed of a metal such as iron, copper or copper alloy.

An opening 111 in which the one set of leads 21, 22 and 23 can be penetratively inserted is formed in the disk-shaped section 11 of the support body 1 and around the columnar body 12. This opening 111 has a wider space on both the left and right sides of the columnar body 12 and an elongate space for receiving the one set of leads 2 (21, 22 and 23) in front of the reference surface 12a of the columnar body 12.

The one set of leads 2 (21, 22 and 23) is put through this opening 111 and placed in position as shown in FIG. 1B. Subsequently, the one set of leads 2 (21, 22 and 23) is integrally fixed to the support body 1 by forming a resin block 31, which is intended for fixation use and has an insulating property, in the opening 111. Although liquid crystal polymer resin is used as a resin material in the present embodiment, it is also acceptable to use PPS, polycarbonate, PBT or the like.

The one set of leads 2 (21, 22 and 23) is formed in a cross-sectionally rectangular shape, i.e., in a strip-like shape in the present embodiment. Then, the columnar body 12 and upper portions of the left and right leads 21 and 23 (second leads) above the disk-shaped section 11 are wholly covered with an insulator (resin member in the present embodiment) 32 except for the reference surface 12a of the columnar body 12 and at least surfaces 21a and 23a of the leads 21 and 23 facing in the same direction as the reference surface 12a (see FIG. 1C).

Of the one set of leads 2 (21, 22 and 23), the lead 22 (first lead) located at the center is electrically connected to the reference surface 12a of the columnar body 12 of the support body 1. Laser welding, electric welding, ultrasonic welding and the like are appropriate as a connecting method. A tip of this lead 22 is completely buried in the resin block 31.

Moreover, a portion which belongs to the resin block 31 or a resin member 32 that almost entirely covers the columnar body 12 and on which light emitted from the semiconductor laser element 3 directly strikes, is formed with an inclined surface. That is, in the present embodiment, a wedge-shaped second resin block 33 (see FIG. 1C and FIG. 2) that has an inclined surface 33a is provided above the center lead 22 embedded in the resin block 31.

With this arrangement, light emitted downward from the semiconductor laser element 3 is reflected at a varied angle on the inclined surface 33a of the second resin block 33. With this arrangement, the reflected light can reliably be prevented from returning to the semiconductor laser element 3. That is, the laser oscillation can be prevented from becoming unstable due to the return of the reflected light to the semiconductor laser element 3.

Next, a method for fabricating the semiconductor laser device of the aforementioned construction will be described referring to FIGS. 1A, 1B and 1C and FIG. 3.

First of all, the one set of leads 2 (21, 22 and 23) connected via the tie bar 20 is inserted from below into the opening 111 formed through the disk-shaped section 11 of the support body 1.

Next, by welding the center lead 22 to the reference surface 12a of the columnar body 12 of the support body 1, the inserted one set of leads 2 (21, 22 and 23) is fixed to the support body 1. As described above, laser welding, electric welding, ultrasonic welding and the like are appropriately used as a welding method.

Next, the one set of leads 2 (21, 22 and 23) fixed to the support body 1 as described above, is introduced into a mold for resin molding (not shown), and a housing portion is resin-molded. Concretely, an upper portion of the support body 1 that is located above the disk-shaped section 11 is resin-molded such that the columnar body 12 and the upper portions of the leads 21 and 23 are molded with resin, except for the reference surface 12a of the columnar body 12 and the surfaces 21a and 23a of the left and right leads 21 and 23 that are located on the same side as the reference surface 12a. With this resin molding, the resin block 31 in the opening 111 and the resin member 32 covering the columnar body 12 are concurrently formed. Further, the second resin block 33 that has the inclined surface 33a is concurrently formed. An insert molding method can be used as a resin molding method at this time.

Subsequently, by mounting the semiconductor laser element 3 on the reference surface 12a of the columnar body 12 and wire bonding one lead 23 to this semiconductor laser element 3, electrical connection is achieved.

Finally, by severing the tie bar 20 that is connecting the leads 21, 22 and 23, a semiconductor laser device is completed.

Figure 3A:
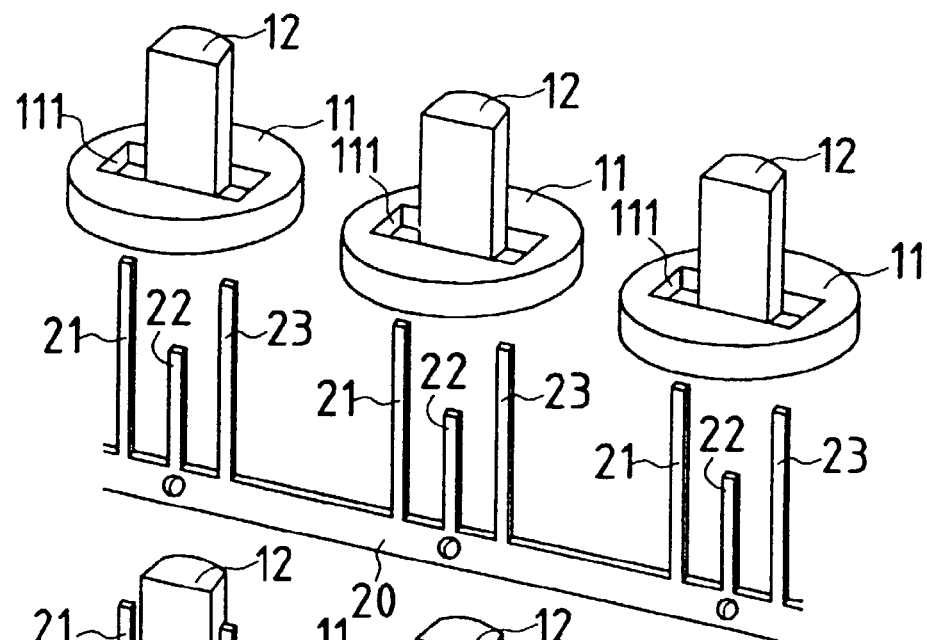
FIGS. 3A, 3B and 3C are explanatory views showing a method for fabricating the semiconductor laser device of the present invention.
Figure 3B:
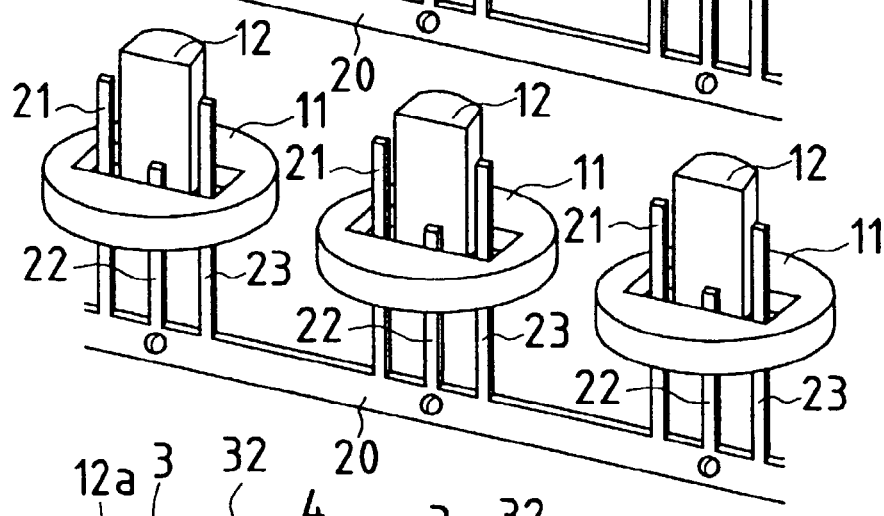
Figure 3C:
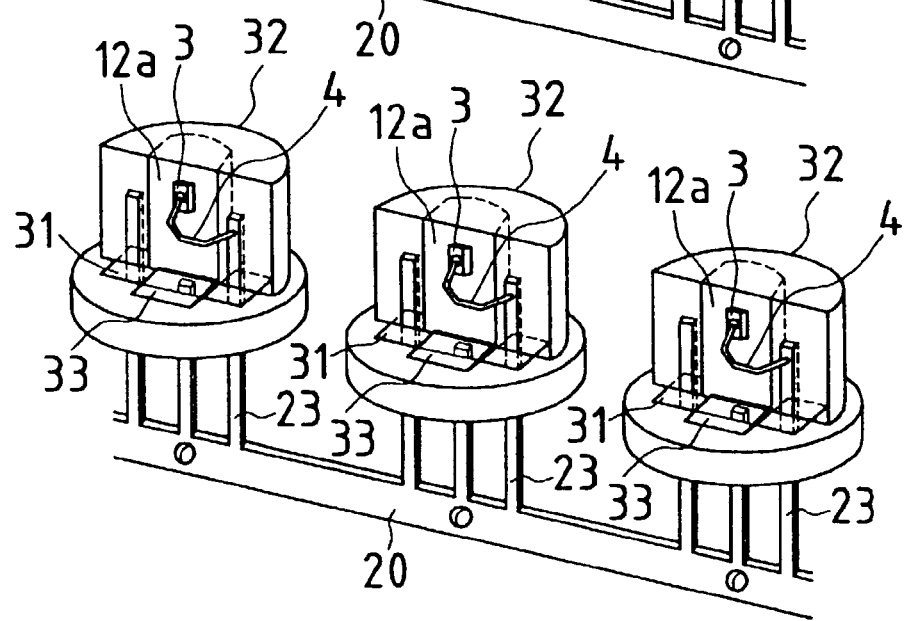
Figure 4B:
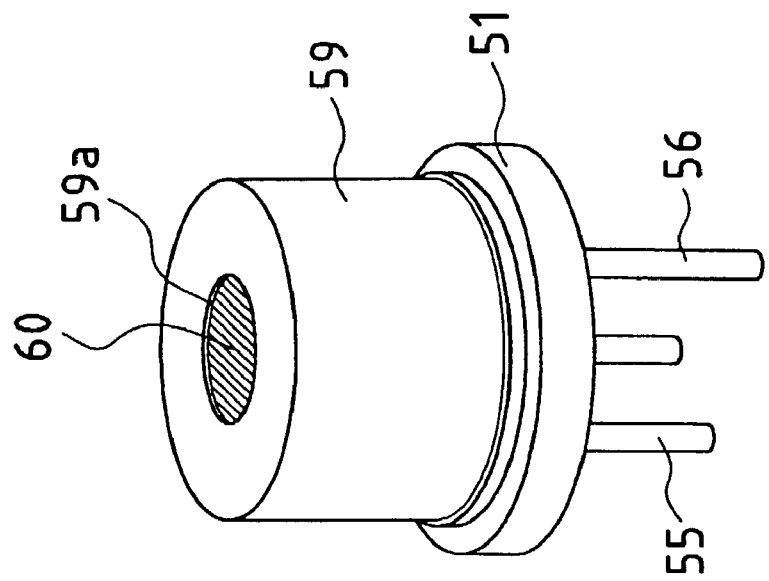
FIGS. 4A and 4B are perspective views of a CAN type semiconductor laser device in different states.
Figure 4A:
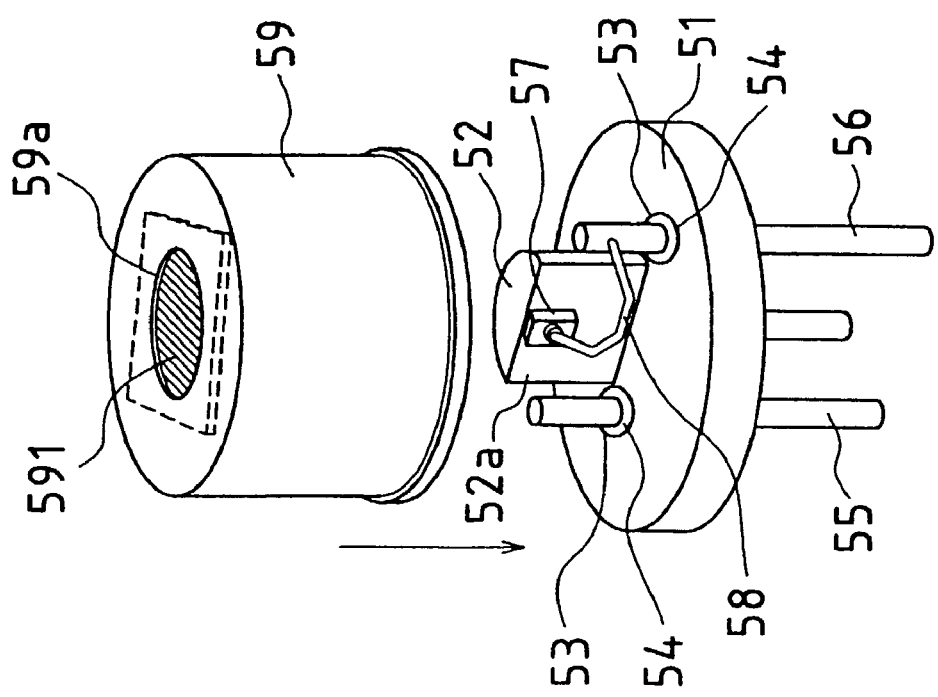
Figure 5:
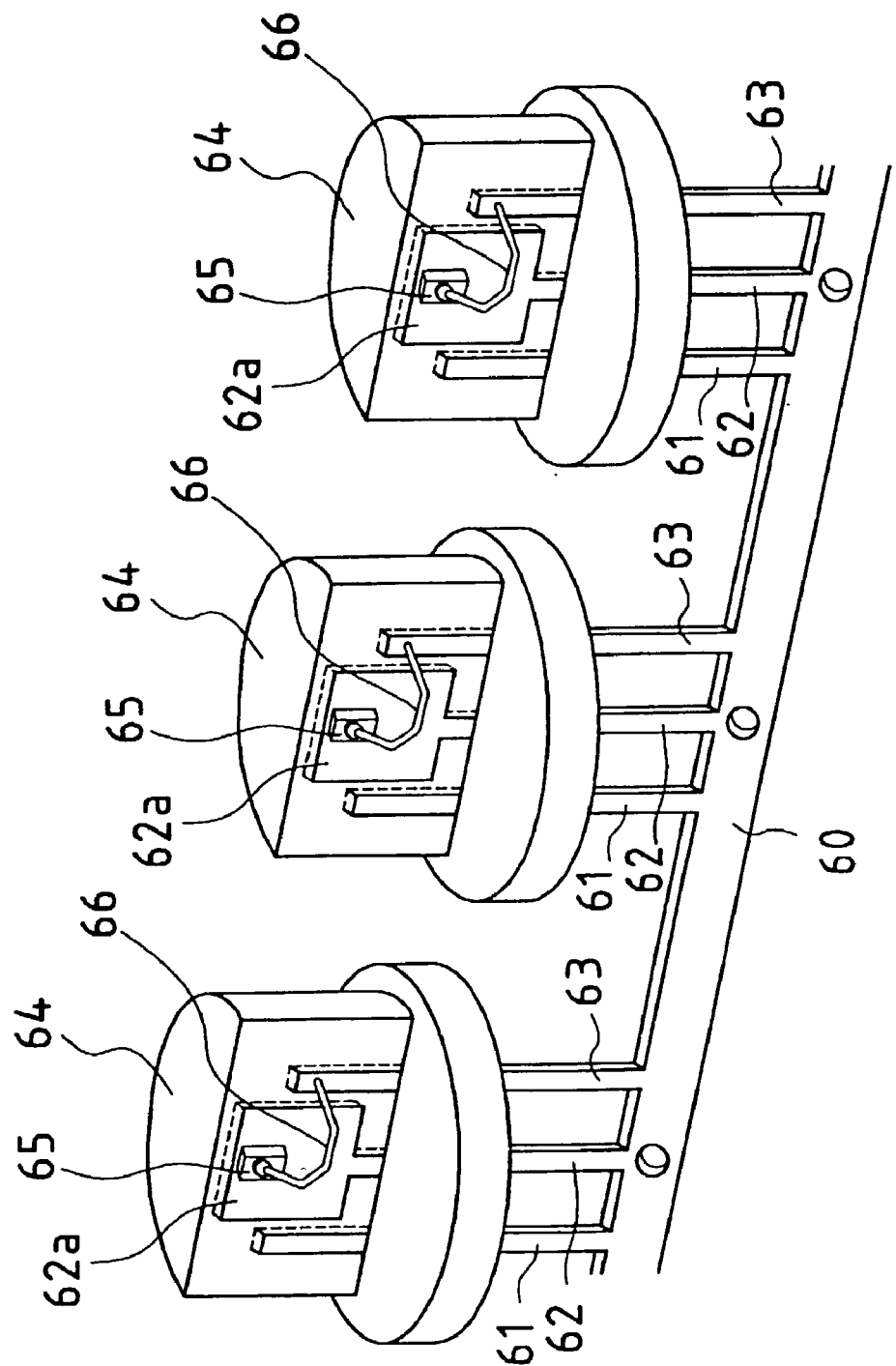
FIG. 5 is a perspective view of a frame laser type semiconductor laser device.

As shown in FIG. 3, the present invention makes it possible to concurrently fabricate a plurality of semiconductor laser devices with the lead frame 2 that has a plurality of sets of leads 21, 22 and 23 joined to one another via the tie bar 20 and a plurality of support bodies 1, 1, . . .

Second Embodiment

This second embodiment is suitable for a case in which the support body has a small external size of not greater than 3.0 mm in diameter. The second embodiment will be described below referring to FIGS. 6A–6C through 8A–8B. In these figures, the portions which are the same as or similar to the portions shown in FIGS. 1A through 3C are denoted by the same reference numerals, and no detailed description is provided therefor.

FIGS. 6A, 6B and 6C show the process steps for fabricating semiconductor laser devices (indicated by No. 1, No. 2, No. 3 and No. 4 in the figures) which employ four different kinds of support bodies 1. In this embodiment as well, one set of (three) leads 21, 22, and 23 is provided by a lead frame 2. FIG. 6A shows a state before each support body 11 and the lead frame 2 are joined to each other. FIG. 6B shows a state in which each support body 11 and the lead frame 2 are joined to each other. FIG. 6C shows a state in which the laser chip is mounted and wire is bonded, with each support body and the lead frame 2 covered with molded resin in an integrated manner.

The case of No. 1 will be described first. In the case of No. 1, as shown in FIG. 6A, the support body 1 is constructed of a disk-shaped section 11 and a columnar body 12. Generally, the support body is formed by a metal in view of electrical conductivity and heat transfer property. Thus, a metal is used for the support body 1 also in the present embodiment. The metallic material of the support body 1 and the metallic material of the lead frame 2, i.e., the leads 21, 22 and 23 are selected so that their linear expansion coefficients become approximately equal to each other. For example, a combination of iron (1.35E-05) and Kovar™ (1.63E-05) may be selected as the metallic material of the support body 1 and the metallic material of the lead frame 2, i.e., the leads 21, 22 and 23. As a material for the support body 1, besides metal, ceramic material is also usable. Also, a high heat transfer resin or the like will become usable in the future. It is to be noted that the description of this support body 1 can be applied to all of the other cases of No. 2 through No. 4.

In the disk-shaped section 11, two rectangular openings 111a for lead insertion use are formed on both sides of and in front of the columnar body 12, and a hole 111b for lead press-fitting use is formed at the center of these openings 111a. Then, as shown in FIG. 6B, leads to be located on both sides (hereinafter referred to as "side leads") 21 and 23 are inserted through the two openings 111a, and the lead located at the center (hereinafter referred to as a "center lead") 22 is press-fit into the hole 111b. Although the hole 111b is shown as a through hole in FIGS. 6A through 6C, it is not always required to penetrate the disk-shaped section 11. By press-fitting the center lead 22 into the hole 111b, this lead is joined to the support body 1. Since the materials of the lead and the support body have approximately same linear expansion coefficients, there can be achieved highly reliable connection capable of maintaining the connection strength in regard to a temperature change.

Subsequently, the resin block 31 to be stuffed into the opening 111a and the resin member 32 for covering the columnar body 12 are formed. A method for forming these members is similar to the method of the first embodiment, and therefore, no description is provided therefor.

Subsequently, by mounting the semiconductor laser element 3 on the reference surface 12a of the columnar body 12 and wire bonding this semiconductor laser element 3 to one side lead 23, electrical connection is achieved.

Finally, by severing the tie bar 20 that is joining the leads 21, 22 and 23, a semiconductor laser device is completed.

Next, with regard to the case of No. 2, only the points different from No. 1 will be described. A caulking hole 111c of a diameter slightly larger than that of the press-fitting hole 111b is formed through the disk-shaped section 11 of the support body 1 in the case of No. 2. By inserting the center lead 22 through this hole 111c and collapsing the tip of the lead, this lead is joined to the support body 11. Reference numeral 22a in FIG. 6B shows the collapsed tip portion of the center lead 22. The joining by caulking (riveting) is able to offer a greater lead pull-out strength than the joining by press-fitting. Moreover, the hole diameter can be enlarged further than that of the hole for press-fitting use. The points other than the above-mentioned points are the same as No. 1.

Next, with regard to the case of No. 3, only the points different from No. 2 will be described. The opening 111a for side lead insertion use provided through the disk-shaped section 11 of the support body 1 in the case of No. 2 is closed in the direction approximately perpendicular to the direction in which the opening 111a runs through the disk-shaped section 11, whereas the opening 111d of No. 3 is open in the direction approximately perpendicular to the direction in which the opening 111d runs through the disk-shaped section 11. That is, the opening has an open end at the outer periphery of the disk-shaped section 11. By thus making the opening 111d open at the outer periphery of the disk-shaped section 11, the press working for the formation of the opening 111d becomes easy. Moreover, as clearly shown in the figures, the width of the opening 111d is narrower in the open portion (on the outer peripheral side) than in the inner or central portion. Therefore, the side leads 21 and 23 and the resin block 31 that holds those leads are prevented from slipping out of these openings 111d and separating from the support body 11. The construction of the No. 3 device is the same as that of the No. 2 device except for the above-mentioned points. It is, of course, acceptable to adopt the hole 111b in place of the hole 111c.

Next, with regard to the case of No. 4, only the points different from No. 3 will be described. In the case of No. 3, the disk-shaped section is provided with one hole 111c and two openings 111d that are opened on the outer peripheral side, and three leads are independently inserted into their associated holes. In contrast, in the case of No. 4, only one opening 111e is provided similarly to the first embodiment, and one set of leads 21, 22 and 23 are inserted together in this opening 111e. It is to be noted that this opening 111e is also configured such that it is opened at the outer periphery of the disk-shaped section similarly to the openings 111d in the case of No. 3 and that the opening is narrower in the peripheral open portion than in the inner, central portion. In the case of No. 4, various welding methods described in connection with the first embodiment can be adopted for the joining of the center lead to the support body 11.

Figure 8A:
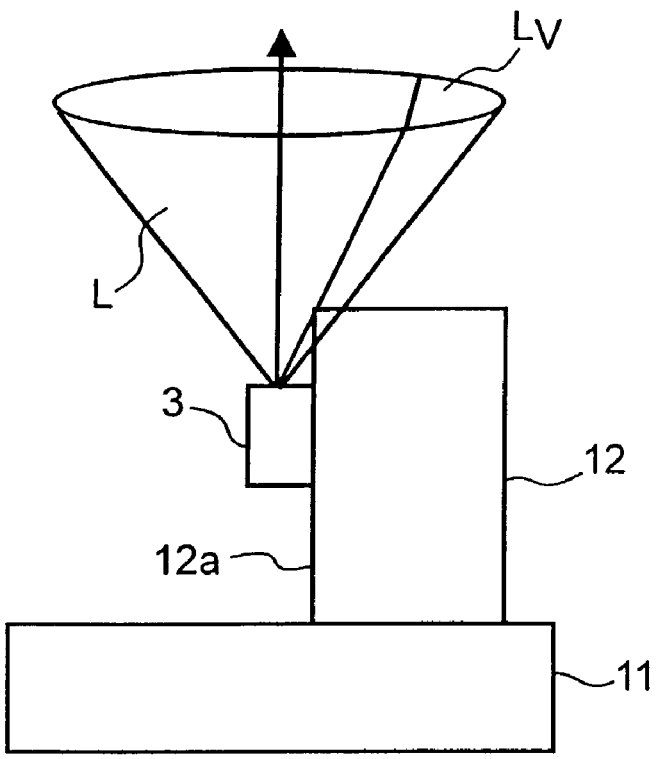
FIG. 8A is a conceptual diagram of laser beam eclipse and FIG. 8B is a conceptual diagram for explaining measures against the laser beam eclipse.
Figure 8B:
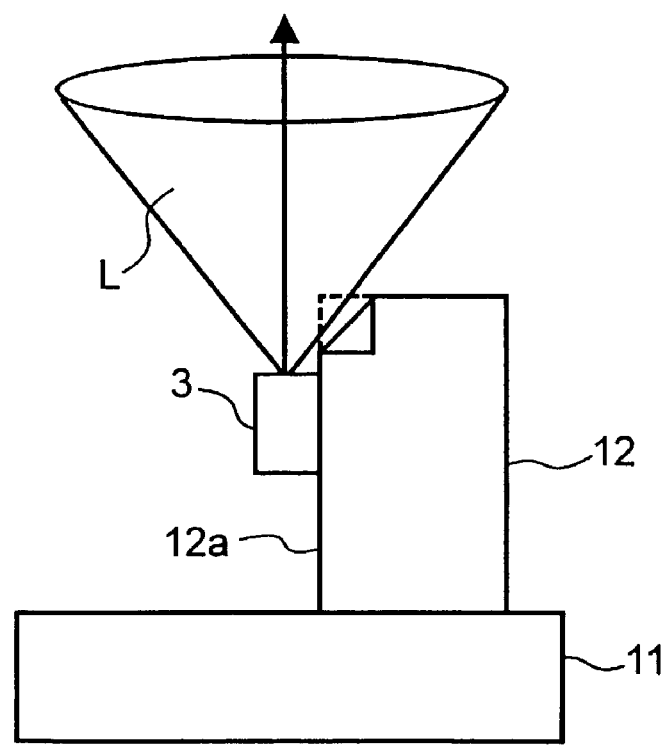

As shown in FIG. 8A, depending on the height of the element mounting surface 12a, a beam L emitted from the mounted semiconductor laser element 3 may be partially cut off by the edge portion of the mounting surface 12a (in the figure, Lv denotes a portion of the laser beam L that is blocked by the edge of the mounting surface 12a), with the result that the originally symmetrical beam shape is impaired. The above-mentioned problem is solved by removing the edge portion of the mounting surface 12a, as shown in FIG. 8B.

Figure 7A:
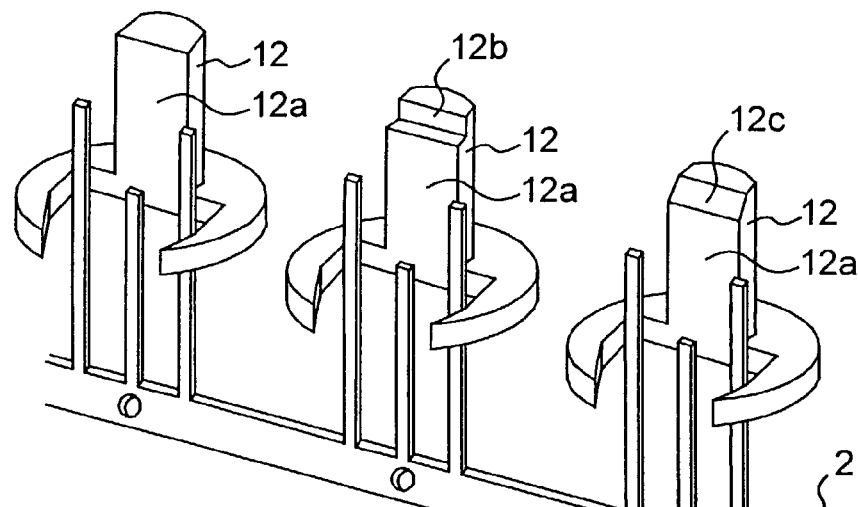
FIGS. 7A and 7B are views showing concrete examples of a support body in which an edge portion of a mounting surface is removed, where
Figure 7B:
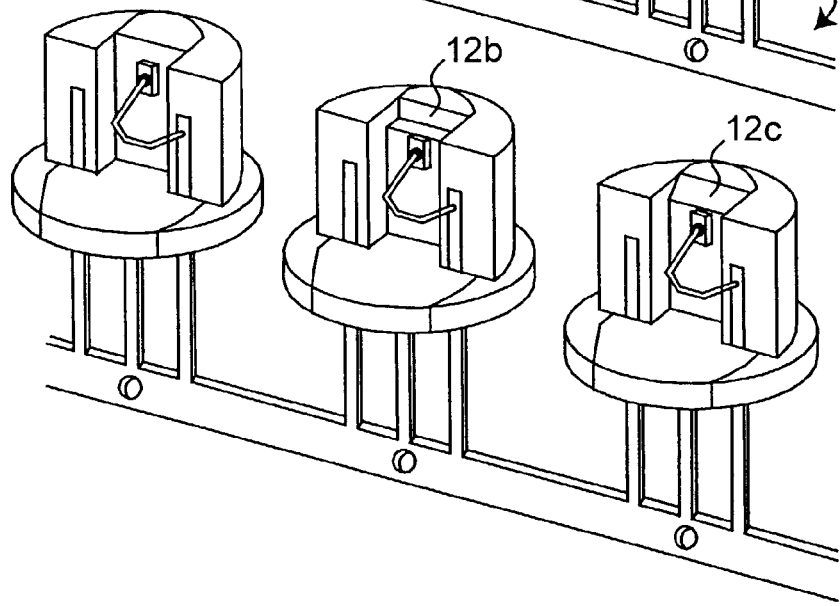

FIGS. 7A and 7B show concrete examples of the support body 111 in which the edge portion of the mounting surface 12a is removed. FIG. 7A shows a state immediately after a lead frame is joined to the support body, while FIG. 7B shows a state after a semiconductor laser element, i.e., a laser chip is mounted and wire-bonded. FIGS. 7A and 7B show three support bodies of different configurations. The support body in the middle has a stepped surface 12b provided at the whole end portion of the element mounting surface 12a, and the right-hand support body has an inclined surface 12c provided on the whole end portion of the element mounting surface 12a. The left-hand support body is provided with no measures against the blocking (eclipse) of the laser beam and is shown for the sake of comparison. In the illustrated devices, the stepped surface 12b and the inclined surface 12c, which are shown formed over the whole edge, may be formed along only a part of the edge if there is an edge portion on which the laser beam L does not strike. Also, configurations other than the stepped and inclined surfaces are also acceptable. Moreover, it is, of course, acceptable to adopt the measures against the blocking (eclipse) of the laser beam, as described above, for the first embodiment.

Furthermore, the inclined surface 33 (means for preventing the laser beam emitted from the laser chip 3 from returning to the laser chip 3) described in connection with the first embodiment may also be formed in the device of the second embodiment.

Although three leads are employed in the aforementioned first and second embodiments, the present invention can also be applied to the case of two leads or four or more leads.

Moreover, although only one lead is joined to the support body in the aforementioned first and second embodiments, it is also possible to join two or more leads to the support body.

Moreover, although the shape of the support body is made compatible with that of the conventional CAN package stem in the aforementioned first and second embodiments, the support body may also have another shape.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
    a conductive support body constructed of a base section and a mounting section provided on the base section;
    a semiconductor laser element mounted on the mounting section; and
    one set of leads integrally fit to the support body, wherein the base section has at least one penetrating opening,
        the one set of leads includes at least one first lead which is electrically and mechanically connected to the support body, and at least one second lead which is not electrically connected to the support body,
        said at least one penetrating opening receives at least the second lead inserted and is filled with a resin block which integrally fixes the lead inserted in the opening to the support body,
    the mounting section and a portion of the second lead that extends along the mounting section are entirely covered with an insulator, except for a reference surface of the mounting section and a surface of the second lead that is located on the same side as the reference surface, and the insulator that covers the mounting section and the second lead is formed of a resin material same as the resin block.

2. The semiconductor laser device according to claim 1, wherein the leads each are rectangular in cross section.

3. The semiconductor laser device according to claim 1, wherein the base section has only one penetrating opening, the one set of leads is inserted in this one opening, and this one set of leads is integrally fixed to the support body by the resin block.

4. The semiconductor laser device according to claim 3, wherein a tip of the first lead is completely buried in the resin block.

5. The semiconductor laser device according to claim 1, wherein the one set of leads and the support body are formed of materials of which linear expansion coefficients are approximately the same.

6. The semiconductor laser device according to claim 5, wherein the base section is further provided with a hole in which the first lead is press-fit so that the first lead is electrically and mechanically connected to the support body.

7. The semiconductor laser device according to claim 5, wherein the base section is further provided with a hole through which the first lead is inserted, with a tip of the first lead, located on the semiconductor laser element side, collapsed or crushed for caulking so that the first lead is electrically and mechanically connected to the support body.

8. The semiconductor laser device according to claim 1, wherein the opening filled with the resin block is open in a direction approximately perpendicular to a direction in which this opening penetrates the base section.

9. The semiconductor laser device according to claim 8, wherein the opening has a width which is narrower in a peripheral open portion than in a central portion.

10. The semiconductor laser device according to claim 1, further comprising means for preventing light emitted from the semiconductor laser element from returning to the semiconductor laser element.

11. The semiconductor laser device according to claim 10, wherein the means for preventing the emitted light from returning to the semiconductor laser element comprises an inclined surface provided on a portion of the resin block on which the emitted light from the semiconductor laser element directly strikes.

12. The semiconductor laser device according to claim 1, wherein in order to prevent light emitted from the semiconductor laser element from being blocked or eclipsed, at least part of an end portion of the laser element mounting surface of the mounting section, which end portion is located on the side from which light from the laser element is emitted to the outside, is cut away.

13. The semiconductor laser device according to claim 12, wherein the laser element mounting surface of the mounting section forms an inclined surface or a stepped surface at the end portion on the side from which light from the laser element is emitted to the outside.

14. The semiconductor laser device according to claim 1, wherein the material of the conductive support body is a metal.

15. A semiconductor laser device comprising:
    a conductive support body constructed of a base section and a mounting section provided on the base section;
    a semiconductor laser element mounted on the mounting section; and
    one set of leads integrally fit to the support body, wherein the base section has at least one penetrating opening,
        the one set of leads includes at least one first lead which is electrically and mechanically connected to the support body, and at least one second lead which is not electrically connected to the support body,
        said at least one penetrating opening receives at least the second lead inserted and is filled with a resin block which integrally fixes the lead inserted in the opening to the support body, and
        the base section has only one penetrating opening, the one set of leads is inserted in this one opening, and this one set of leads is integrally fixed to the support body by the resin block.

16. A semiconductor laser device comprising:
    a conductive support body constructed of a base section and a mounting section provided on the base section;
    a semiconductor laser element mounted on the mounting section; and
    one set of leads integrally fit to the support body, wherein the base section has at least one penetrating opening,
        the one set of leads includes at least one first lead which is electrically and mechanically connected to the support body, and at least one second lead which is not electrically connected to the support body,
        said at least one penetrating opening receives at least the second lead inserted and is filled with a resin block which integrally fixes the lead inserted in the opening to the support body, and
        the opening filled with the resin block is open in a direction approximately perpendicular to a direction in which this opening penetrates the base section.

* * * * *